United States Patent [19]

Kleinberg

[11] Patent Number: 4,521,702
[45] Date of Patent: Jun. 4, 1985

[54] REACTANCELESS SYNTHESIZED IMPEDANCE BANDPASS AMPLIFIER

[75] Inventor: Leonard L. Kleinberg, Greenbelt, Md.

[73] Assignee: The United States of America as represented by the Administrator, National Aeronautics and Space Administration, Washington, D.C.

[21] Appl. No.: 434,085

[22] Filed: Oct. 13, 1982

[51] Int. Cl.³ .................... H03F 3/34; H03G 9/20; H03H 11/04

[52] U.S. Cl. .................... 307/520; 307/271; 307/521; 307/529; 328/167; 330/302; 330/306

[58] Field of Search ............... 307/510, 514, 516, 520, 307/521–523, 525, 526, 529, 271; 328/21, 134, 138, 141, 167; 330/107, 109, 192, 294, 302, 306

[56] References Cited

U.S. PATENT DOCUMENTS

| | | | |
|---|---|---|---|
| 3,955,150 | 5/1976 | Soderstrand | 328/167 X |
| 3,983,334 | 9/1976 | Takahashi et al. | 330/294 X |
| 4,032,857 | 6/1977 | Lum | 328/167 X |
| 4,147,997 | 3/1979 | Greaves | 330/107 X |
| 4,168,440 | 9/1979 | Gray | 328/167 X |
| 4,185,250 | 1/1980 | Regan | 330/107 |
| 4,382,233 | 5/1983 | Hofer | 330/107 |
| 4,383,230 | 5/1983 | Manzolini | 307/520 X |

OTHER PUBLICATIONS

Senani et al., "New Canonic Active RC Realizations of Grounded and Floating Inductors", Proc. IEEE (USA), vol. 66, No. 7, Jul. 1978, pp. 803–804.
Panicker, "Simulated Inductance for Low Frequency Filter", Electronic Engineering, Nov. 1976, p. 19.

*Primary Examiner*—Stanley D. Miller
*Assistant Examiner*—D. R. Hudspeth
*Attorney, Agent, or Firm*—John R. Tresansky; John R. Manning; Robert D. Marchant

[57] ABSTRACT

An active R bandpass filter network (10) is formed by four operational amplifier stages interconnected by discrete resistances. One pair of stages (12, 14) synthesizes an equivalent input impedance of an inductance ($L_{eq}$) in parallel with a discrete resistance ($R_0$) while the second pair of stages (16, 18) synthesizes an equivalent input impedance of a capacitance ($C_{eq}$) serially coupled to another discrete resistance ($R_i$) coupled in parallel with the first two stages. The equivalent input impedances aggregately define a tuned resonant bandpass filter in the roll-off regions of the operational amplifiers.

11 Claims, 3 Drawing Figures

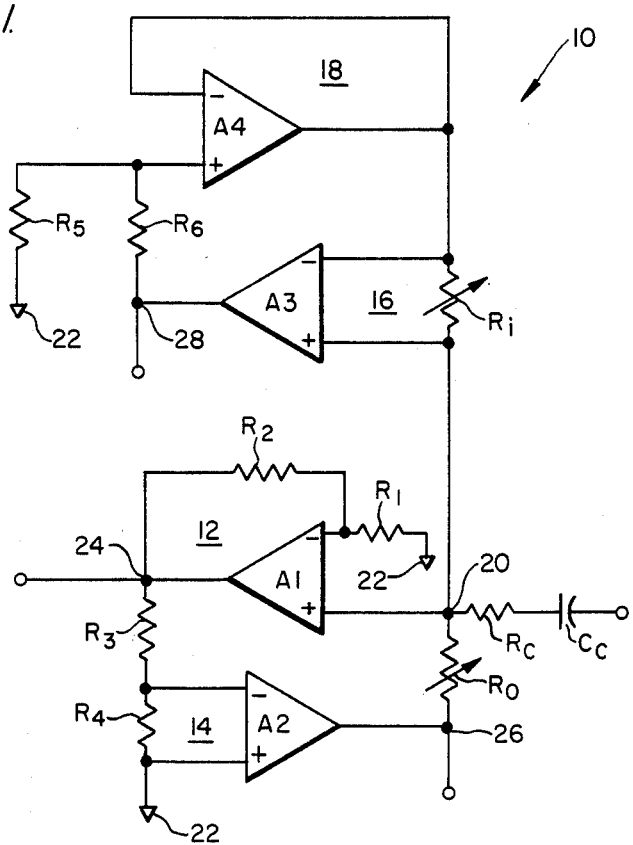

REACTANCELESS SYNTHESIZED IMPEDANCE BANDPASS AMPLIFIER

ORIGIN OF THE INVENTION

The invention described herein was made by an employee of the United States Government and may be manufactured and used by or for the Government for governmental purposes without the payment of any royalties thereof or therefor.

TECHNICAL FIELD

This invention relates generally to bandpass filters and, more particularly, to an active R reactanceless synthesized impedance bandpass amplifier.

BACKGROUND ART

Active electronic filters, particularly bandpass amplifiers, are well known in the art. They are usually constructed with at least one active device and several discrete passive resistive and reactive components. A dual-input differential amplifier, commonly referred to as an "operational amplifier," is an active device exhibiting a very high, open loop gain, over a wide bandwidth, a very high input impedance, and a very low output impedance. Widespread commercial availability of operational amplifiers and their nearly ideal characteristics make them the preferred active devices for use in active filters. Additionally, operational amplifiers are readily suited to integrated circuit fabrication. To take advantage of the economy, compactness and versatility of integrated circuits, it is desirable to design amplifier circuits which are suitable for integrated circuit fabrication. Amplifier circuits having only resistive passive components are particularly suitable because they may be made as monolithic devices capable of functioning without external passive impedance components.

Recent proposals for integrated active filter circuits having operational amplifiers include the class of filters called "active R" filters. These filters are constructed with only resistive passive components. Amplifier circuits having only resistive passive components provide two significant advantages. First, resistances can be made to exhibit greater stability than any of the other passive components. Second, resistance components may be made easily adjustable, thereby enabling a circuit to be tuned over a band of frequencies without significantly effecting stability of the circuit. One proposed design relies upon the existence of a resistive-capacitive equivalent in the transfer function of a differential input amplifier to form a bandpass filter with only two passive components, both resistances, and two operational amplifiers. The performance of that particular design provides only minimal improvement over an equivalent circuit constructed with transistors because it relies upon a change of gain with frequency to provide filtering and lacks both the tunability and sharpness of conventional inductive-capacitive tuned filter circuits.

STATEMENT OF INVENTION

Accordingly, it is one object of the present invention to provide an improved active reactanceless synthesized impedance filter network.

It is another object to provide an active synthesized impedance filter network having only resistive passive components.

It is yet another object to provide an improved active R reactanceless synthesized impedance bandpass filter network.

It is a further object to provide an active R reactanceless synthesized impedance network synthesizing a tuned bandpass filter network.

It is a still further object to provide a resistively tuned, active reactanceless synthesized impedance bandpass filter network exhibiting stable linear input characteristics over a wide bandwidth.

These and other objects are achieved by a reactanceless synthesized impedance bandpass filter network formed by two pairs of resistance-operational amplifier stages coupled between a common network input terminal and a common reference potential. One pair of stages synthesizes a single pole input equivalent inductance by shifting the phase response of its resistive impedance while the other pair of stages synthesizes a single pole input equivalent capacitance first pair of stages by shifting the phase response of its resistive impedance when the network is tuned to a frequency within the roll-off regions of the operational amplifiers.

BRIEF DESCRIPTION OF DRAWINGS

A more complete appreciation of this invention and, many of the attendant advantages thereof, will be readily apparent as the same becomes better understood by reference to the following detailed description when considered in conjunction with the accompanying drawings in which like number indicate the same or similar components, and wherein:

FIG. 1 is a schematic representation of an embodiment of the invention;

FIG. 2 is a two coordinate graph showing the voltage gain as a function of bandwidth for a representative differential input operational amplifier; and, FIG. 3 is a schematic representation of an electrical equivalent of the input impedance for the embodiment shown in FIG. 1.

DETAILED DESCRIPTION OF THE INVENTION

FIG. 1 illustrates an active R, tuned bandpass filter network 10 formed by four active stages 12, 14, 16, 18, each formed around an operational amplifier A1, A2, A3, A4, respectively. The stages are coupled in pairs, in parallel, between a common network input terminal and a common network reference potential at node 22. The first pair of active stages 12, 14 synthesizes an input inductance while the second pair of stages 16, 18 synthesizes an input capacitance. In effect, these two pairs of stages provide an input function equivalent to an inductance coupled in parallel with a capacitance across nodes 20, 22 of the network. A serially connected resistance $R_c$ and capacitance $C_c$ serve as impedance matching components to couple node 20 to an input anolog signal source.

FIG. 2 illustrates the gain as a function of frequency for a typical, commercially available single pole operational amplifier of the type suitable for use as operational amplifiers in each of the stages of network 10. The gain for these types of active devices is characterized by a slightly negative slope over the band of frequencies between one Hertz and their minus three decibel (roll-off) frequencies, $f_{-3\,db}$. In the band (the "roll-off region") between their roll-off frequencies and their unity gain frequencies, $f_G$, these devices exhibit a single pole negative slope of approximately six decibels per octave. While all of the operational amplifiers have roll-off and unity-gain frequencies, the values of those frequencies may differ for different models of operational amplifiers. It should be noted that at the roll-off frequency, the open loop gain of an operational amplifier is typically on the order of thousands of decibels. A gain of this magnitude is extremely difficult to control because, for example, a small variation in the amplitude of an input signal can drive an operational amplifier into saturation, thereby temporarily eliminating the linearity of its responsive characteristics. Stability of an active network having operational amplifiers, therefore, requires the use of one or more resistances in the signal paths of the network to attenuate the gain introduced by the operational amplifiers to more manageable levels.

Stage 12 of the first pair of stages 12, 14, serves as a signal path with the non-inverting port (+) of operational amplifier A1 directly coupled to node 20. Resistances $R_1$ and $R_2$ provide a voltage divider between node 22, the inverting port, and the output port to reduce the open loop gain of operational amplifier A1 to a lower value, thereby assuring a linear response characteristic more consonant with the stability usually desired for a multi-stage network such as network 10. In effect, resistances $R_1$ and $R_2$ form a feedback loop, thereby making the first stage into a conventional non-inverting differential input amplifier stage connected between input node 20 and an output node 24 of the network.

The second stage 14 includes operational amplifier A2 and a variable resistance $R_0$ which provides an input conductance serving to create a voltage drop between the output port of operational amplifier A2 and input node 20, A pair of resistances $R_3$, $R_4$ are serially connected between nodes 20 and 24 as a voltage divider. The inverting port (−) of operational amplifier A2 is coupled to the junction between $R_3$ and $R_4$. The non-inverting port (+) of operational amplifier A2 is directly coupled to node 22. Resistance $R_3$ provides a voltage drop between the output port of operational amplifier A1 and the inverting input port of operational amplifier A2 while resistance $R_4$ provides a potential difference between the inverting and non-inverting parts of operational amplifier A2. In effect, the second stage 14 forms an inverting feedback loop between the output and input ports of operational amplifier A1 while resistances $R_3$ and $R_4$ cause some attenuation of a signal traveling through this loop, thereby providing a degree of stability to the first pair of coupled stages.

The input admittance, $Y_{in}$, provided between nodes 20, 22 by the first and second stages 12, 14 may be expressed by the general closed loop feedback equation:

$$Y_{in}=(1-k_v(f)\cdot Y_{fb} \tag{1}$$

where $k_v(f)$ is the voltage gain of the coupled stages as a function of frequency and $Y_{fb}$ is, in effect, the feedback admittance provided by the combined first and second stages. The voltage gain, $k_v(f)$, provided at the output port of operational amplifier A2 of the coupled stages 12, 14 may be expressed as:

$$K_v(f) = \frac{-k_0 G_L \beta_L}{1+j} = \frac{-G_L \beta_L}{\frac{1}{k_0}+j\frac{f}{k_0 f_3}} \tag{3}$$

where $k_o$ is the open loop gain introduced through the inverting port of operational amplifier A2, $G_L$ is the gain provided by first stage 12, L is the attenuation provided by resistances $R_3$ and $R_4$. By reference to FIG. 2, it may be seen that:

$$f_{-3\,db}k_0=f_G \tag{3}$$

where $f_{-3\,db}$ and $f_G$ are the minus three decibel frequency and the unity gain frequency, respectively for a typical operational amplifier. Substituting equation (3) into equation (2), it may be seen that for the large values of $k_o$ typically occurring between $f_{-3\,db}$ and $f_G$ in the commercially available operational amplifiers suitable for use as A1 and A2, the voltage gain function of equation (2) can be expressed as:

$$K_v(f) = \frac{-G_L \beta_L}{j\frac{f}{f_G}} = j\frac{f_G G_L \beta_L}{f} \tag{4}$$

The gain provided by stage 12 is determined by the values of resistances $R_1$ and $R_2$, and may be expressed as:

$$G_L = 1 + R_2/R_1 \tag{5}$$

Similarly, the attenuation provided by the second stage 14 is determined by the values of resistances $R_3$ and $R_4$, and may be expressed as:

$$\beta_L = \frac{R_4}{R_3 + R_4} \tag{6}$$

The closed loop feedback admittance of the combined first and second stages is determined by the value of resistance $R_o$. Accordingly, by substitution of equations (4), (5) and (6) into equation (1), the input admittance is:

$$Y_{in} = \left[1 - j\frac{f_G}{f}\right]\left[\frac{R_1 + R_2}{R_1} \cdot \frac{R_4}{R_3 + R_4}\right]\frac{1}{R_0} \tag{7}$$

Equation (7) indicates that over the frequency spectrum in the roll-off region of operational amplifier A2, the coupled first and second stages 12, 14 provide an equivalent input admittance between nodes 20 and 22 having a conductance equal in value to the reciprocal of resistance $R_o$ in series with a negative, single pole susceptance. This is equivalent to a resistance equal in value to $R_o$ in parallel with an inductance, $L_{eq}$, between nodes 20 and 22, where:

$$L_{eq} = \frac{1}{2f_G}\left[\frac{R_1 + R_2}{R_1} \cdot \frac{R_4}{R_3 + R_4}\right]\frac{1}{R_0} \tag{8}$$

The presence of resistance $R_o$ and of resistances $R_1$, $R_2$, $R_3$ and $R_4$ in equation (8) establishes that over its roll-off region the feedback loop provided by operational amplifier A2 creates a phase shift of the input admittances of the first and second stages, thereby causing the lumped conductances of $R_o$, $R_1$, $R_2$, $R_3$ and $R_4$ to appear as constituent parts of a negative susceptance. At the roll-off frequency, $f_{-3\,db}$, phase shift is about forty-five degrees while at frequencies near ten times the roll-off frequency this phase shift approaches ninety degrees. Over the band between one hundred times the roll-off frequency and the unity-gain frequency, the phase shift of the lumped conductances is ninety degrees. If operational amplifier such as an OP-07 manufactured by Precision Monolithics, Incorporated of Santa Clara, Calif., having a roll-off frequency of one Hertz and a unity gain frequency of five hundred mega Hertz, are used for operational amplifiers A1, A2, A3 and A4, the bumped conductances of resistances $R_o$, $R_1$, $R_2$, $R_3$ and $R_4$ will be subjected to a ninety degree phase shift over the band between one hundred Hertz and five hundred mega Hertz by operational amplifier A2 in the second stage, thus presenting an equivalent input inductive susceptance between nodes 20 and 22 of the network.

In the second pair of coupled stages 16, 18, stage 16 serves as a signal path. A variable resistance $R_i$ is connected across the input ports of operational amplifier A3 of third stage 16. The non-inverting (+) input port of operational amplifier A3 is coupled directly to node 20. $R_i$ provides an input impedance for the second pair of stages while developing a potential difference between the input ports of operational amplifier A3. The output port of operational amplifier A3 is coupled to node 22 via a pair of serially connected resistances $R_5$ and $R_6$ which provide attenuation of any signal passed by the third stage 16 to assure the stability of the third stage. The fourth stage 18 has a single operational amplifier A4 with its non-inverting port (+) coupled to the junction between resistances $R_5$ and $R_6$. The inverting port (−) and output port of operational amplifier A4 are both coupled directly to the inverting port of operational amplifier A3. In effect, operational amplifier A4 is a unity-gain voltage follower coupled between the junction between resistances $R_5$ and $R_6$ and the inverting port of operational amplifier A3, and acts as a feedback loop serving to stabilize the operation of the third stage.

The input impedance, $Z_{in}$, provided between nodes 20, 22 by the third and fourth stages 16, 18 may be expressed by the general closed loop feedback equation:

$$Z_{in} = Z_i(1 + G_C \beta_C k_v(f)) \tag{9}$$

where $k_v(f)$ is the voltage gain of the coupled third and fourth stages as a function of frequency and $Z_i$ is the input impedance of the loop. For the coupled third and fourth stages, the gain-bandwidth function may be expressed as:

$$K_v(f) = \frac{k\, G_c\, \beta_c}{1 + j\frac{f}{f_3}} \rightarrow -j\frac{f_G G_c \beta_c}{f} \tag{10}$$

The fourth stage 18, which acts as a voltage follower for the third stage, provides a gain, $G_c$, of one. The attenuation provided by the coupled third and fourth stages between nodes 20 and 22 is determined by the values of resistances $R_5$ and $R_6$, and may be expressed as:

$$\beta_c = \frac{R_5}{R_5 + R_6} \tag{11}$$

The closed loop feedback impedance of the coupled third and fourth stages is determined by the value of resistance $R_i$. Substitution of these values into equations (9) and (10) gives an input impedance for the coupled third and fourth stages of:

$$Z_{in} = R_i - j\frac{f_G}{f} \cdot \frac{R_5}{R_5 + R_6} \cdot R_i \tag{12}$$

By observation, it is apparent that the third and fourth stages provide an input impedance across nodes 20 and 22 equivalent to a resistance equal in value to $R_i$ in series with a single pole, negative reactance. This reactance effectively provides an equivalent capacitance, $C_{eq}$, where:

$$C_{eq} = \frac{1}{2\pi f_G} \cdot \frac{R_5}{R_5 + R_6} \cdot \frac{1}{R_i} \tag{13}$$

Equations (7) and (12) illustrate that over the frequency spectrum in the roll-off region of operational amplifier A3, the combined third and fourth stages 16, 18 provide a positive single pole reactance in the equivalent input circuit of network 10. The presence of resistance $R_5$, $R_6$ and $R_i$ in equation (13) establishes that over its roll-off region, operational amplifier A3 creates a phase shift of the input impedances of the third and fourth stages, thereby causing lumped resistances $R_5$, $R_6$ and $R_i$ to appear as constituent parts of an equivalent input capacitive impedance between nodes 20 and 22.

FIG. 3 schematically illustrates a tuned circuit formed by the electrical equivalent input functions of the four stages 12, 14, 16 and 18. In effect, stages 12 and 14 provide a resistance $R_o$ in parallel with an equivalent inductance, $R_{eq}$. In turn, stages 1b and 18 provide a resistance $R_i$ in series with an equivalent capacitance $C_{eq}$ parallel with $R_o$ and $L_{eq}$ across input terminal nodes 20, 22. The resonant frequency of the equivalent input circuit is controlled by the values of the synthesized reactances $L_{eq}$ and $C_{eq}$. As indicated by equations (8) and (13) where the values of resistances $R_1$ through $R_6$ are fixed, the resonant frequency may be varied over the roll-off region between $f_3$ and $f_G$ of operational amplifiers A2 and A3 by adjusting the values of either or both resistances $R_o$ and $R_i$.

It is apparent from the foregoing that the invention disclosed is a network in which two separate and opposite type single pole reactances are synthesized by two pairs of active R stages to provide a bandpass amplifier tuned to a frequency in the roll-off region between $f_{-3\,db}$ and $f_G$ of operational amplifiers A2 and A3. The use of only resistive passive components facilitates fabrication while avoiding the variations in stability due to such causes as differences in the tolerances and ambient temperature sensitivity between resistive and reactive components which plague currently available tuned resonant amplifiers and active filters having lumped reactive components. The resonant frequency, gain, and Q of the network 10 may be broadly controlled by the values of resistances $R_i$ and $R_o$. The gain is primarily determined by the relative values of resistances $R_1$ and $R_2$ while the network Q is primarily set by the values of resistances $R_3$, $R_4$, $R_5$ and $R_6$. In practice, the network gain and Q are design parameters determined by the characteristics of the operational amplifiers and the particular application for which the network is intended. Consequently, the network may be constructed without one or more of the resistances shown in FIG. 1. For example, resistance $R_1$ may be eliminated from the network to provide a first stage with a unity gain. Additionally, either resistance $R_o$ or $R_i$ or both may be made variable to provide a tunable resonant network. In other applications, all of the resistances may have fixed values and the entire network may be monolithically constructed by integrated circuit techniques as a single device.

An output signal from network 10 may be taken directly from the output port of operational amplifier A1 at node 24. In such an application, network 10 will act as a bandpass filter if the center frequency determined by the relative values of the synthesized $L_{eq}$ and $C_{eq}$ is designed to be within the roll-off regions of operational amplifiers A2 and A3. Preferably to avoid phase distortion, the center frequency should be set to fall within a band between ten times the roll-off frequency and the unity gain frequency of operational amplifiers A2 and A3. To assure predictable performance of the network, in any application the operational amplifiers A2 and A3 should be selected to exhibit nearly equal gain-bandwidth products (i.e., nearly equal roll-off frequencies). Preferably, the gain-bandwidth products and roll-off frequencies of operational amplifiers A1 and A4 are well beyond the gain-bandwidth products and roll-off frequencies of operated amplifiers A2 and A3.

For a different application, e.g., phase detection, separate output signals taken from nodes 26 and 28 will exhibit phase shifts of plus and minus ninety degrees, respectively, from an input signal applied to input terminal node 20, thereby providing paraphase amplification of the input signal.

I claim:

1. An active filter network, comprising:
   a pair of active circuits (12-14, 16-18) each having first (A1, A3) and second (A2, A4) operational amplifiers coupled together to provide multiple feedback loops therein;
   means (20) for applying an input signal directly to a non-inverting input port of each of said first operational amplifiers in each of said pair of circuits;
   first resistive means (R$_1$, R$_2$) included within a first of said feedback loops for attenuating the amplitude of signals between an output port and inverting input port of said first operational amplifiers (A1) in a first of said pair of circuits (12-14);
   second resistive means (R$_3$, R$_4$, R$_0$) included within said first of said feedback loops in conjunction with said second operational amplifier (A2) in said first of said pair of circuits (12-14) for attenuating and inverting the amplitude of signals between said output port and non-inverting input port of said first operational amplifier in said first of said pair of circuits; and
   third resistive means (R$_i$, R$_5$, R$_6$) included within a second of said feedback loops in conjunction with said second operational amplifier (A4) in a second of said pair of circuits (16-18) coupled in a voltage follower configuration for attenuating the amplitude of signals between the output port and said non-inverting input port of said first operational amplifier in said first of said pair of circuits;
   wherein said resistive means are of a magnitude to tune each of said circuits to operate in the gain versus frequency roll-off region of said second operational amplifier (A2) in said first of said pair of circuits (12-14) and said first operational amplifier (A3) in said second of said pair of circuits (16-18), thereby providing an equivalent inductive reactance by said first of said pair of circuits and an equivalent capacitive reactance by said second of said pair of circuits to said input signal at frequencies in said roll-off region.

2. The active filter network of claim 1 wherein said second operational amplifier (A2) in said first of said pair of circuits (12-14) and said first operational amplifier (A3) in said second of said pair of circuits (16-18) exhibit near equal roll-off characteristics.

3. The active filter network of claim 2 wherein said second operational amplifier (A4) in said second of said pair of circuits (16-18) and said first operational amplifier (A1) in said first of said pair of circuits (12-14) exhibit roll-off characteristics at substantially higher frequencies than said second operational amplifier (A2) in said first pair of circuits and said first operational amplifier (A3) in said second of said pair of circuits.

4. The active filter network of claim 3 wherein said resistive means are of a magnitude to tune each of said pair of circuits to a frequency range between ten times the roll-off frequency (f$_{-3\ db}$) and the unity gain frequency (f$_G$) of said second operational amplifier (A2) in said first of said pair of circuits (12-14) and said first operational amplifier (A3) in said second of said pair of circuits (16-18).

5. The active filter network of claim 1 wherein said first and second resistive means of said first feedback loop includes a pair of resistors (R$_1$, R$_2$) both having one end connected to the inverting port of said first operational amplifier (A1) in said first of said pair of circuits and their other ends connected, respectively, to ground and to the output port of said first operational amplifier (A1) in said first of said pair of circuits, a resistor (R$_4$) connected across input ports of said second operational amplifier (A2) in said first of said pair of circuits and having one end thereof connected to ground, a resistor (R$_3$) connected between the output port of said first operational amplifier (A1) in said first of said pair of circuits and an inverting port of said second operational amplifier (A2) in said first of said pair of circuits, and a resistor (R$_0$) connected between the non-inverting port of said first operational amplifier (A1) in said first of said pair of circuits and an output port of said second operational amplifier (A2) in said first of said pair of circuits.

6. The active filter of claim 1 wherein said third resistive means of said second feedback loop includes a resistor (R$_i$) connected across input ports of said first operational amplifier (A3) in said second of said pair of circuits, a pair of resistors (R$_5$, R$_6$) both having one end connected to a non-inverting port of said second operational amplifier (A4) in said second of said pair of circuits and their other ends respectively connected to ground and to an output port of said first operational amplifier (A3) in said second of said pair of circuits, and an inverting port and an output port of said second operational amplifier (A4) in said second of said pair of circuits being commonly connected.

7. The active filter of claim 5 wherein said third resistive means of said second feedback loop includes a resistor (R$_i$) connected across the input ports of said first operational amplifier (A3) in said second of said pair of circuits, a pair of resistors (R$_5$, R$_6$) both having one end connected to the non-inverting port of said second operational amplifier (A4) in said second of said pair of circuits and their other ends respectively connected to ground and to the output port of said first operational amplifier (A3) of said second of said pair of circuits, and the inverting port and output port of said second operational amplifier (A4) of said second of said pair of circuits being commonly connected.

8. An active filter network, comprising:

means (20) for receiving an input signal;

a first active circuit (12) having a first operational amplifier (A1) with a non-inverting input port coupled directly to said receiving means, a first resistance ($R_1$) coupling an inverting input port of said first operational amplifier to a reference potential, and a second resistance ($R_2$) coupling said inverting input port to an output port of said first operational amplifier;

a second active circuit (14) having a second operational amplifier (A2) with a non-inverting input port coupled to said reference potential, a third resistance ($R_3$) serially coupling said output port of said first operational amplifier to an inverting input port of said second operational amplifier, a fourth resistance ($R_4$) coupling said non-inverting and inverting input ports of said second operational amplifier, and a fifth resistance ($R_0$) coupling an output port of said second operational amplifier to said receiving means;

a third active circuit (16) having a third operational amplifier (A3) with a non-inverting input port coupled directly to said receiving means, a sixth resistance ($R_i$) coupling said non-inverting input port to an inverting input port of said third operational amplifier, and seventh and eight resistances ($R_5$, $R_6$,) coupling an output port of said third operational amplifier to said reference potential; and a fourth active circuit (18) having a fourth operational amplifier (A4) with an inverting input port and an output port coupled directly to said inverting port of said third operational amplifier and a non-inverting port coupled between said seventh and eighth resistances, wherein said resistances are of magnitudes to tune said first and second active circuits and said third and fourth active circuits, respectively, to operate in the gain versus frequency roll-off regions of said second and third operational amplifiers, thereby providing an equivalent inductive reactance by said first and second circuits and an equivalent capacitive reactance by said third and fourth circuits to said input signal at frequencies in said roll-off region.

9. The network of claim 8 wherein said roll-off frequencies of said second and third operational amplifiers are substantially equal.

10. The network of claim 8 wherein said roll-off frequencies of said first and fourth operational amplifiers are substantially greater than the roll-off frequencies of said second and third operational amplifiers.

11. The network of claim 9 wherein said roll-off frequencies of said first and fourth operational amplifiers are substantially greater than the roll-off frequencies of said second and third operational amplifiers.

* * * * *